(12) United States Patent
Pagaila et al.

(10) Patent No.: US 7,977,802 B2
(45) Date of Patent: Jul. 12, 2011

(54) INTEGRATED CIRCUIT PACKAGING SYSTEM WITH STACKED DIE AND METHOD OF MANUFACTURE THEREOF

(75) Inventors: Reza Argenty Pagaila, Singapore (SG); Byung Tai Do, Singapore (SG); Linda Pei Ee Chua, Singapore (SG)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 12/398,782

(22) Filed: Mar. 5, 2009

(65) Prior Publication Data
US 2010/0225007 A1   Sep. 9, 2010

(51) Int. Cl.
*H01L 23/48* (2006.01)
*H01L 23/52* (2006.01)
*H01L 23/02* (2006.01)
*H01L 21/44* (2006.01)
*H01L 21/48* (2006.01)

(52) U.S. Cl. ........ 257/778; 257/686; 257/777; 257/784; 438/106; 438/108; 438/109

(58) Field of Classification Search .................. 257/778, 257/777, 782, 783, 730, 686, 723, 784; 438/106, 438/108, 109
See application file for complete search history.

(56) References Cited

U.S. PATENT DOCUMENTS

| | | | |
|---|---|---|---|
| 6,777,797 B2 * | 8/2004 | Egawa | 257/686 |
| 7,242,101 B2 | 7/2007 | Ararao et al. | |
| 7,432,604 B2 | 10/2008 | Farnworth et al. | |
| 7,456,108 B2 | 11/2008 | Fukazawa | |
| 7,459,776 B1 | 12/2008 | St. Amand et al. | |
| 2003/0162325 A1 * | 8/2003 | Tan et al. | 438/109 |
| 2007/0052082 A1 | 3/2007 | Lee et al. | |

* cited by examiner

*Primary Examiner* — Chuong A. Luu
(74) *Attorney, Agent, or Firm* — Mikio Ishimaru

(57) ABSTRACT

A method of manufacture of an integrated circuit packaging system includes: forming a flip chip die, having a backside protrusion; mounting a wire bond die on the flip chip die, adjacent to the backside protrusion; and mounting an internal stacking module over the backside protrusion and the wire bond die.

20 Claims, 5 Drawing Sheets

INTEGRATED CIRCUIT PACKAGING SYSTEM WITH STACKED DIE AND METHOD OF MANUFACTURE THEREOF

TECHNICAL FIELD

The present invention relates generally to an integrated circuit packaging system, and more particularly to a system for packaging stacked integrated circuit devices.

BACKGROUND ART

In the electronics industry, as products such as cell phones, game controllers, personal video players, and camcorders become smaller and smaller, increased miniaturization of integrated circuit (IC) packages has become more and more critical. At the same time, higher performance and lower cost have become essential for new products.

Usually, many individual integrated circuit devices are constructed on the same wafer and groups of integrated circuit devices are separated into individual integrated circuit die. An integrated circuit package may hold multiple of the same type of die or it may be mixed with die from a completely different technology.

In order to interface an integrated circuit die with other circuitry, it is common to mount it on a leadframe or on a multi-chip module substrate that is surrounded by a number of lead fingers. Each die has bonding pads that are then individually connected in a wire bonding operation to the lead fingers of the leadframe using extremely fine gold (Au) or aluminum (Al) wires. The assemblies are then packaged by individually encapsulating them in molded plastic, epoxy, or ceramic bodies.

One approach to putting more integrated circuit dies in a single package involves stacking the dies with space between the dies for wire bonding. The space is achieved by means of a thick layer of organic adhesive or in combination with inorganic spacers of material such as silicon (Si), ceramic, or metal. Unfortunately, the stacking adversely affects the performance of the package because of decreased thermal performance due to the inability to remove heat through the organic adhesive and/or inorganic spacers. As the number of dies in the stack increases, thermal resistance increases at a faster rate. Further, such stacked dies have a high manufacturing cost.

Another approach is to put more integrated circuit dies side-by-side in a single package but this results in packages taking up large areas on the printed circuit boards. As consumer electronic devices are constantly shrinking, adding to the size of the printed circuit board is unacceptable.

Each attempt to reduce the size of the integrated circuit package tends to create additional problems with cost, heat transfer, and electrical performance. Thus, a need still remains for an integrated circuit packaging system with stacked die to simplify the assembly process while preserving thermal characteristics of the finished package. In view of the industry demand for higher density and smaller integrated circuit packages, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a flip chip die, having a backside protrusion; mounting a wire bond die on the flip chip die, adjacent to the backside protrusion; and mounting an internal stacking module over the backside protrusion and the wire bond die.

The present invention provides an integrated circuit packaging system including: a flip chip die, having a backside protrusion; a wire bond die on the flip chip die, adjacent to the backside protrusion; and an internal stacking module over the backside protrusion and the wire bond die.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
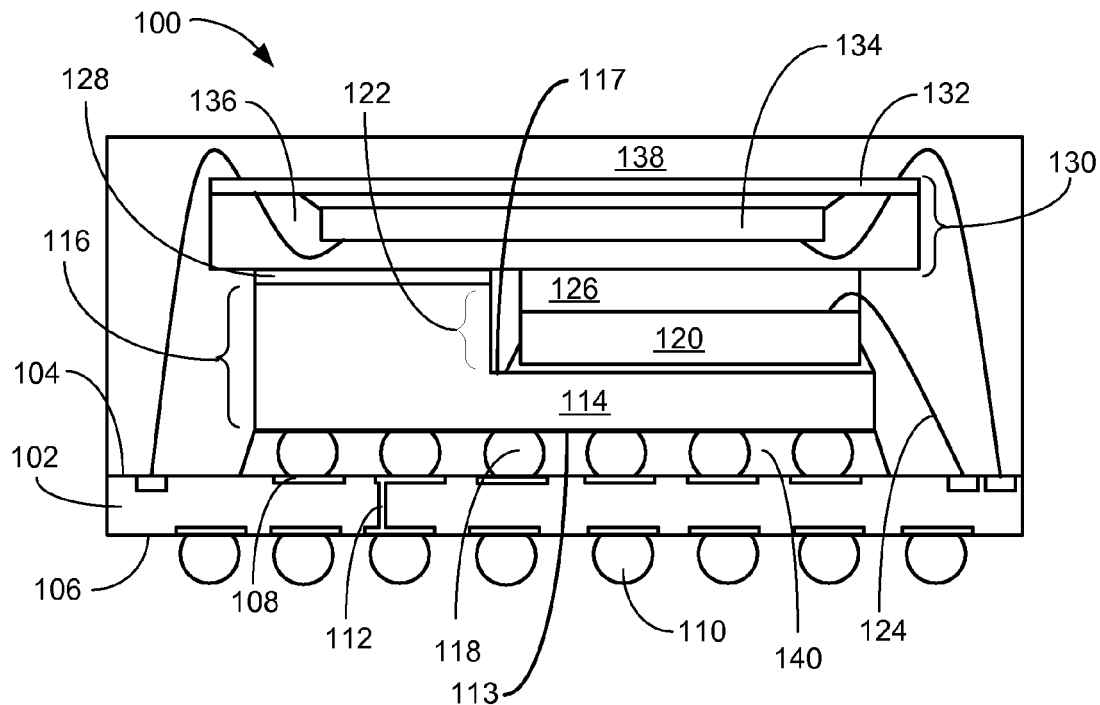
FIG. 1 is a cross-sectional view of an integrated circuit packaging system in an embodiment of the present invention as viewed through the section line 1-1 of FIG. 3.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described, having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the flip chip integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact among elements.

The term "processing" as used herein includes deposition of material or photoresist, patterning, exposure, development, etching, cleaning, and/or removal of the material or photoresist as required in forming a described structure.

Figure 3:
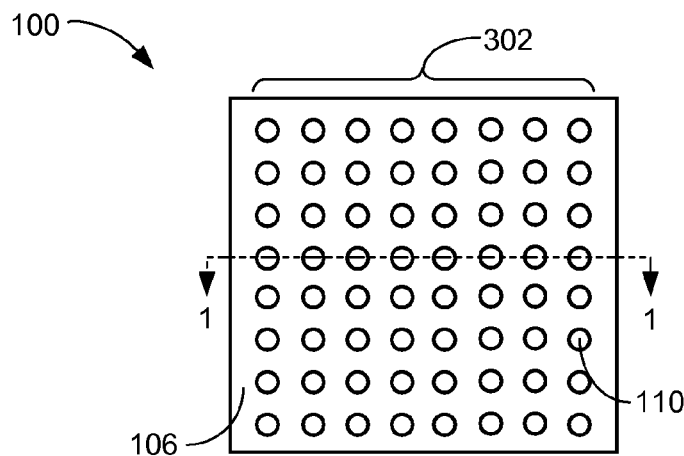
FIG. 3 is a bottom view of the integrated circuit packaging system of FIG. 1.

Referring now to FIG. 1, therein is shown a cross-sectional view of an integrated circuit packaging system 100 in an embodiment of the present invention as viewed through the section line 1-1 of FIG. 3. The cross-sectional view of the integrated circuit packaging system 100 depicts a package substrate 102 having a component side 104 and a system side 106. Contact pads 108 may be formed on both the component side 104 and the system side 106. System interconnects 110 may be coupled to the contact pads 108 on the system side 106 and the component side 104 by a via 112.

An active side 113 of a flip chip die 114, having a backside protrusion 116 on an inactive side 117, may be coupled to the contact pads 108 by chip interconnects 118, such as solder balls, solder bumps, solder columns, or stud bumps. The backside protrusion 116 may be formed to cover any portion of the flip chip die 114 for providing an L-shaped cross-section.

The flip chip die 114 utilizes a direct electrical connection of the active side 113 down (hence, "flipped") onto substrates, circuit boards, or carriers, by means of the chip interconnects 118 on the die bond pads (not shown). In contrast, wire bonding, the older technology which flip chip is replacing, uses face-up integrated circuits (not shown) with a wire connection to each contact pads 108.

A wire bond die 120 may be mounted on the inactive side 117 of the flip chip die 114 adjacent to the backside protrusion 116. The wire bond die 130 is positioned, with only one side adjacent to the backside protrusion 116, in a vertex of the L-shaped cross-section. The wire bond die 120 may be thinner than a step height 122 of the backside protrusion 116.

An electrical interconnect 124 may couple the active side of the wire bond die 120 to the contact pad 108 on the component side 104 of the package substrate 102. A wire-in-film adhesive 126 may be attached on the active side of the wire bond die 120 and the electrical interconnect 124.

The wire-in-film adhesive 126 has a low viscosity and, as temperature increases, the viscosity gets lower. Therefore, the wire-in-film adhesive 126 can be easily pressed over the electrical interconnects 124 and above and around the wire bond die 120 and then cured to harden the wire-in-film adhesive 126.

It has been discovered that the wire-in-film adhesive 126 should be a thermally conductive dielectric material. The wire-in-film adhesive 126 can be made of a B-stage material that can be hardened after curing and can maintain a predetermined thickness.

An adhesive 128 may be applied on the backside protrusion 116. The adhesive 128 and the wire-in-film adhesive 126 may form a platform for an internal stacking module 130, such as an integrated circuit package, a stacking substrate, an integrated circuit die, or a heat spreader.

The internal stacking module 130 is a device within the package profile that is over the backside protrusion 116 and the wire bond die 120. The internal stacking module 130 is device for enhancing the function of the integrated circuit packaging system 100 by adding capabilities or functions that are directly adhered to the adhesive 128 and the wire-in-film adhesive 126.

The internal stacking module 130 may have a substrate 132 with an integrated circuit die 134 mounted thereon. The integrated circuit die 134 may be a wire bond type or a flip chip type that is coupled to the substrate 132 by the chip interconnects 118 or the electrical interconnects 124. A molded body 136 may be formed on the substrate 132, the integrated circuit die 134, and the electrical interconnects 124 or the chip interconnects 118.

A stacked package body 138 may encapsulate the component side 104 of the package substrate 102, the flip chip die 114, the wire bond die 120, the wire-in-film adhesive 126 and the internal stacking module 130. A sealant 140, such as an underfill material, may optionally be injected between the component side 104 and the active side 113 of the flip chip die 114 so to enclose the chip interconnects 118.

It has been discovered that by providing the backside protrusion 116 on the flip chip die 114, assembly of the integrated circuit packaging system 100 may be faster and less costly than convention stacked packages. The backside protrusion 116 replaces a spacer (not shown) in the conventional assembly process. By eliminating the spacer, less of the adhesive 128 may be used and a process step to position and mount the spacer is no longer necessary. This represents a savings in both material and time. Also by eliminating a layer of the adhesive 128, better thermal flow characteristics are possible.

It is understood that the shape of the backside protrusion 116 is an example only and the shape and size may differ. In some applications, the wire bond die 120 may be mounted between two or more of the backside protrusions 116. It is further understood that the internal stacking module 130 may be formed having the substrate 132, such as a laminate or ceramic substrate, or it may be formed having lead fingers that were singulated from a lead frame (not shown).

Figure 2:
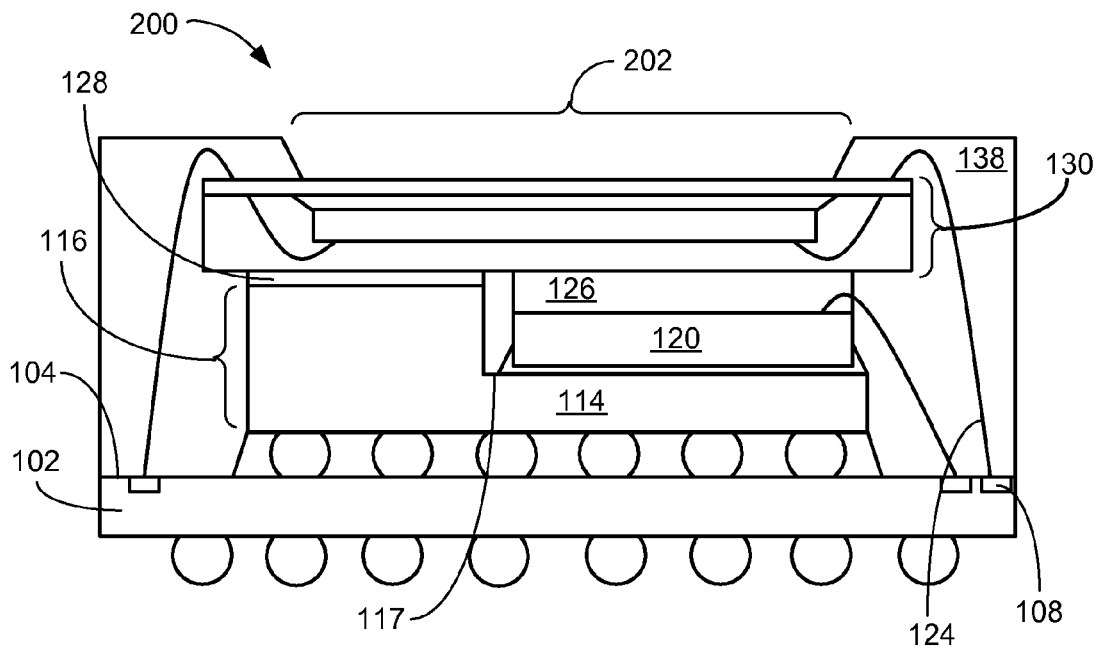
FIG. 2 is a cross-sectional view of an integrated circuit packaging system in a second embodiment of the present invention as viewed in a substantially similar cross-section to FIG. 1.

Referring now to FIG. 2, therein is shown a cross-sectional view of an integrated circuit packaging system 200 in a second embodiment of the present invention as viewed in a substantially similar cross-section to FIG. 1. The cross-sectional view of the integrated circuit packaging system 200 depicts the flip chip die 114 mounted on the package substrate 102 with the wire bond die 120 mounted on the inactive side 117 of the flip chip die 114 adjacent to the backside protrusion 116.

The adhesive 128 and the wire-in-film adhesive 126 may form a platform for the internal stacking module 130. The electrical interconnects 124 may couple the internal stacking module 130 to the contact pad 108 on the component side 104 of the package substrate 102. The stacked package body 138, having a stacking recess 202, may be formed on the component side 104 of the package substrate 102, the flip chip die 114, the wire bond die 120, the wire-in-film adhesive 126 and the internal stacking module 130.

The stacking recess 202 may provide a mounting platform for an additional stacked device (not shown), such as an integrated circuit package, an integrated circuit die, a heat sink, discrete components, or a combination thereof. It has been discovered that by providing the stacking recess 202, the integrated circuit packaging system 200 may supply increased package reliability by decreasing the operating temperature of the internal stacking module 130.

Referring now to FIG. 3, therein is shown a bottom view of the integrated circuit packaging system 100 of FIG. 1. The bottom view of the integrated circuit packaging system 100 depicts the system side 106 having an array 302 of the system interconnects 110. A section line 1-1 shows the position and direction of view of the cross section in FIG. 1. It is understood that the number and position of the system interconnects 110 in the array 302 is an example only and the number and position may differ. It is also understood that the shape of the array while generally rectangular may have other shapes or patterns.

Figure 4:
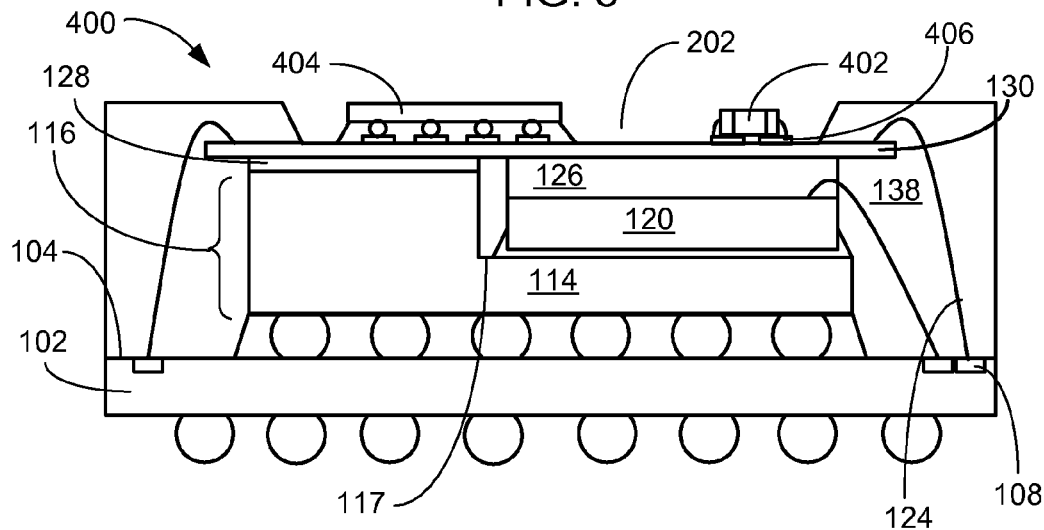
FIG. 4 is a cross-sectional view of an integrated circuit packaging system in a third embodiment of the present invention as viewed in a substantially similar cross-section to FIG. 1.

Referring now to FIG. 4, therein is shown a cross-sectional view of an integrated circuit packaging system 400 in a third embodiment of the present invention as viewed in a substantially similar cross-section to FIG. 1. The cross-sectional view of the integrated circuit packaging system 400 depicts the flip chip die 114 mounted on the package substrate 102 with the wire bond die 120 mounted on the inactive side 117 of the flip chip die 114 adjacent to the backside protrusion 116.

The adhesive 128 and the wire-in-film adhesive 126 may form a platform for the internal stacking module 130. The electrical interconnects 124 may couple the internal stacking module 130 to the contact pad 108 on the component side 104 of the package substrate 102. The stacked package body 138, having the stacking recess 202, may be formed on the component side 104 of the package substrate 102, the flip chip die 114, the wire bond die 120, the wire-in-film adhesive 126 and the internal stacking module 130, such as the stacking substrate.

The internal stacking module 130 may support attaching a discrete component 402, an external device 404, or a combination thereof to external pads 406 that may be exposed in the stacking recess 202. While the external device 404 is shown as a flip chip integrated circuit, it could also be a wire bond chip, a flip chip package, quad flat no-lead package, or a leaded package. The discrete component 402 may be a passive component such as a resistor, a capacitor, or an inductor. The discrete component 402 may also be a more complex device such as a voltage regulator, an oscillator, or a filter network. While the discrete component 402 and the external device 404 are shown to fall within the plane of the top surface of the stacked package body 138, this is an example only and the height of these devices may differ.

Figure 5:
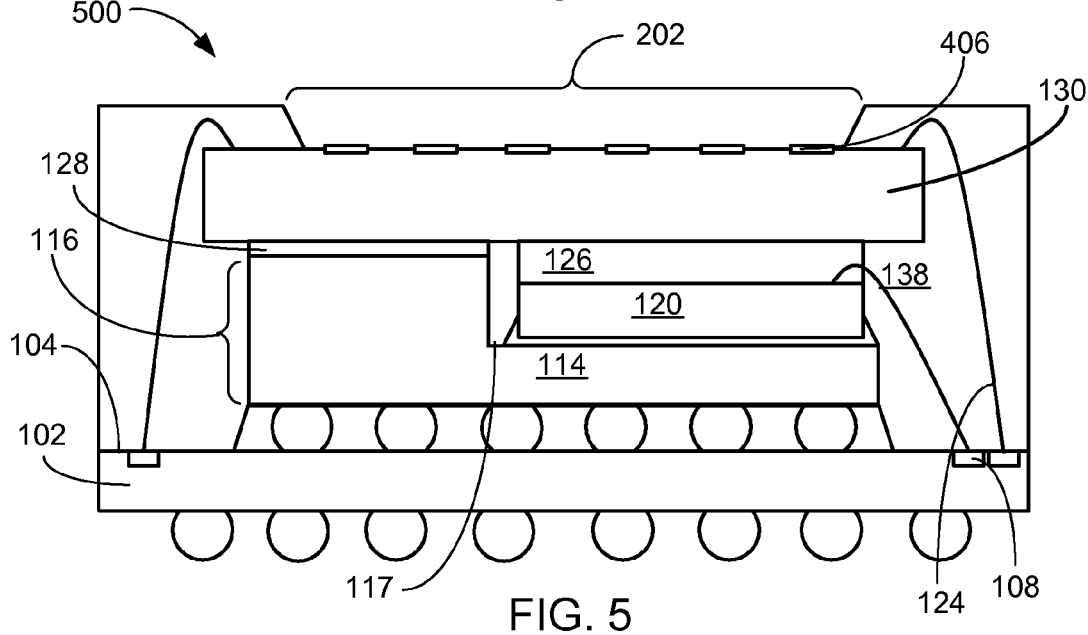
FIG. 5 is a cross-sectional view of an integrated circuit packaging system in a fourth embodiment of the present invention as viewed in a substantially similar cross-section to FIG. 1.

Referring now to FIG. 5, therein is shown a cross-sectional view of an integrated circuit packaging system 500 in a fourth embodiment of the present invention as viewed in a substantially similar cross-section to FIG. 1. The cross-sectional view of the integrated circuit packaging system 500 depicts the flip chip die 114 mounted on the package substrate 102 with the wire bond die 120 mounted on the inactive side 117 of the flip chip die 114 adjacent to the backside protrusion 116.

The adhesive 128 and the wire-in-film adhesive 126 may form a platform for the internal stacking module 130. The electrical interconnects 124 may couple the internal stacking module 130 to the contact pad 108 on the component side 104 of the package substrate 102. The stacked package body 138 may be formed on the component side 104 of the package substrate 102, the flip chip die 114, the wire bond die 120, the wire-in-film adhesive 126 and the internal stacking module 130, such as the integrated circuit die.

The stacked package body 138 may optionally have the stacking recess 202 for exposing the external pads 406. In the event that the internal stacking module 130 is the integrated circuit die without the external pads 406, the stacked package body 138 may be formed without the stacking recess 202. This implementation would present a flat contiguous surface on the stacked package body 138.

In the example shown the external pads 406 may be used to mount the discrete component 402, the external device 404, or a heat spreader (not shown).

Figure 6:
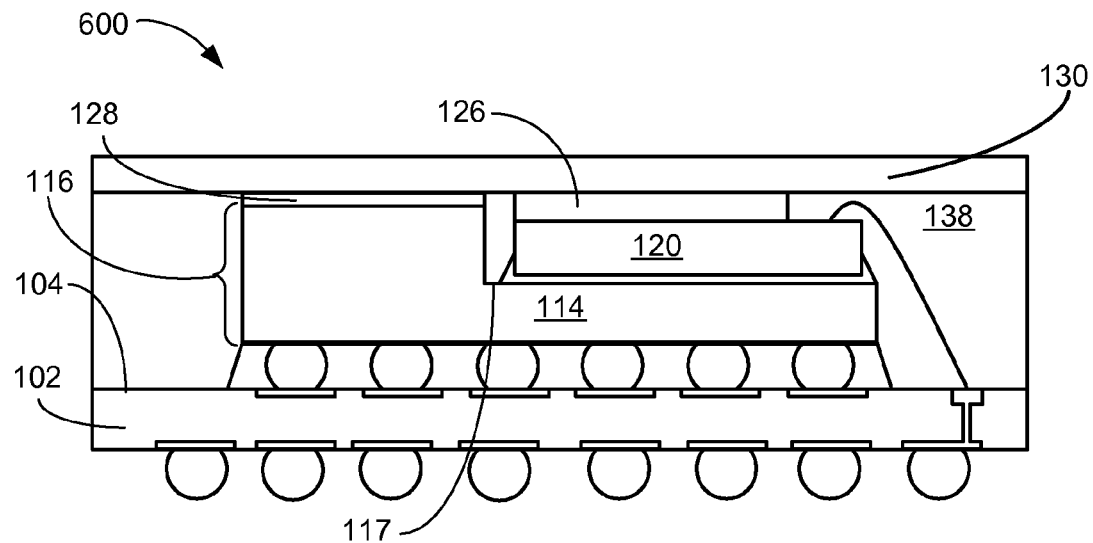
FIG. 6 is a cross-sectional view of an integrated circuit packaging system in a fifth embodiment of the present invention as viewed in a substantially similar cross-section to FIG. 1.

Referring now to FIG. 6, therein is shown a cross-sectional view of an integrated circuit packaging system 600 in a fifth embodiment of the present invention as viewed in a substantially similar cross-section to FIG. 1. The cross-sectional view of the integrated circuit packaging system 600 depicts the flip chip die 114 mounted on the package substrate 102 with the wire bond die 120 mounted on the inactive side 117 of the flip chip die 114 adjacent to the backside protrusion 116.

The adhesive 128 and the wire-in-film adhesive 126 may form a platform for the internal stacking module 130. The wire-in-film adhesive 126 may optionally be replaced by a thermal interface material, such as a thermal epoxy. The stacked package body 138 may be formed on the component side 104 of the package substrate 102, the flip chip die 114, the wire bond die 120, the wire-in-film adhesive 126 and the internal stacking module 130, such as the heat spreader.

It has been discovered that the integrated circuit packaging system 600 may provide a very efficient thermal management system for high performance versions of the flip chip die 114 and the wire bond die 120. The internal stacking module 130 is shown as a flat sheet heat spreader by way of an example only. It is understood that the internal stacking module 130 may optionally be a finned heat spreader.

Figure 7:
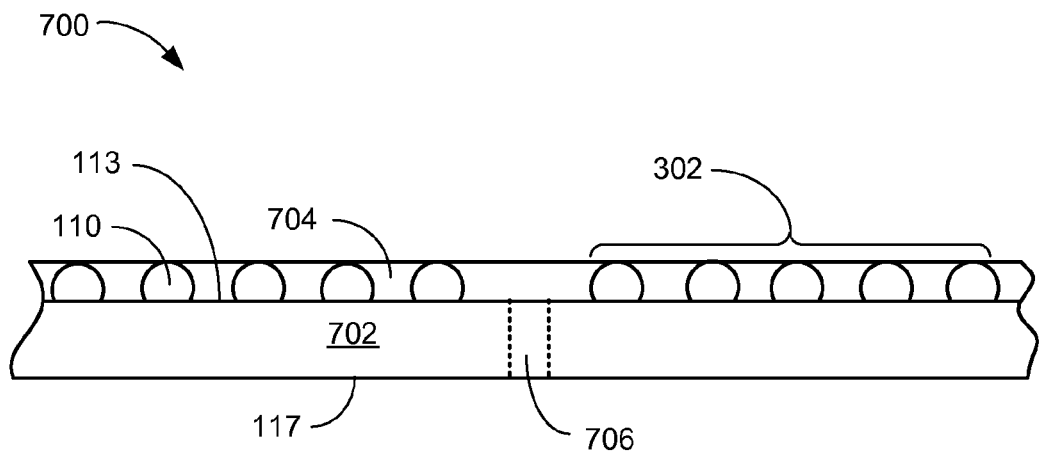
FIG. 7 is a cross-sectional view of a flip chip semiconductor wafer, in a bump protection phase of manufacturing, as viewed through the section line 7-7 of FIG. 10.
Figure 10:
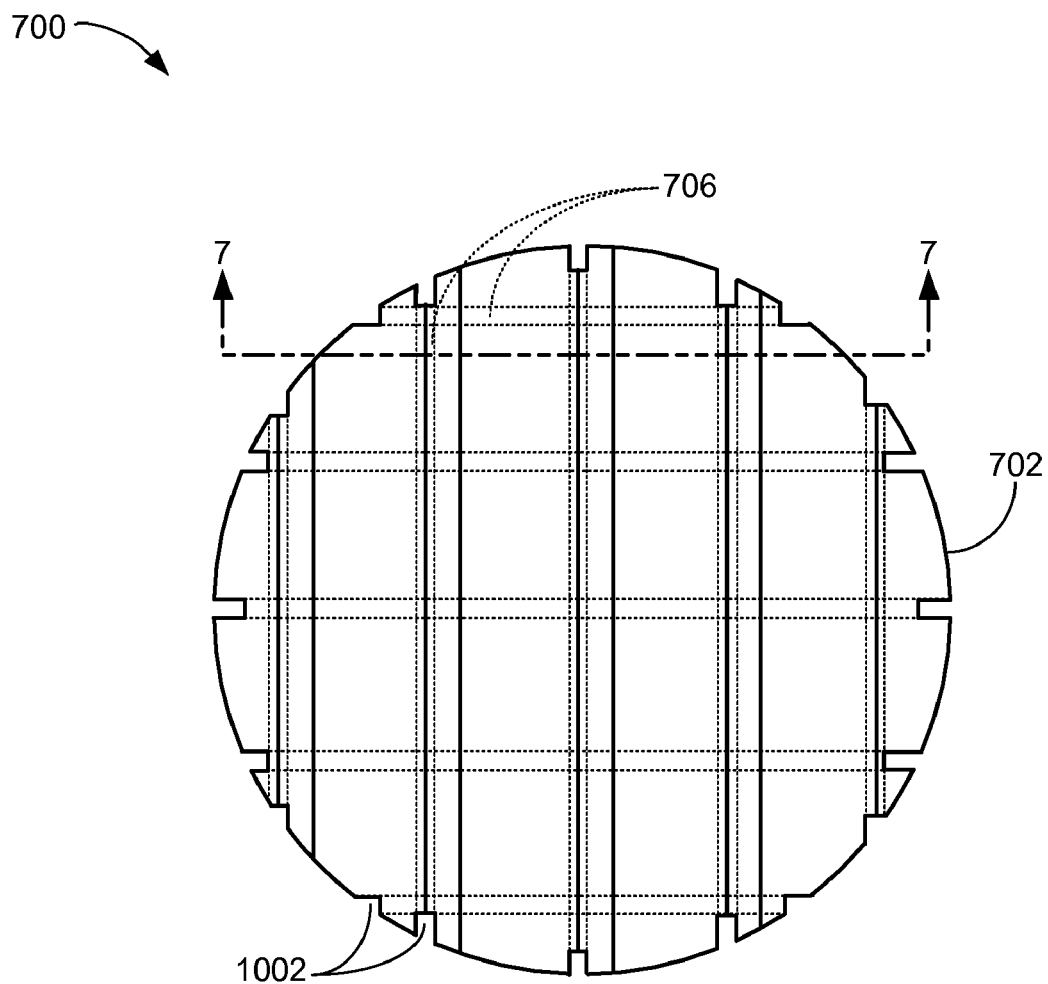
FIG. 10 is a top view of the flip chip semiconductor wafer in a pre-singulation phase of manufacturing.

Referring now to FIG. 7, therein is shown a cross-sectional view of a flip chip semiconductor wafer 700, in a bump protection phase of manufacturing, as viewed through the section line 7-7 of FIG. 10. The cross-sectional view of the flip chip semiconductor wafer 700, as viewed along a section line 7-7 of FIG. 10, depicts a segment of a semiconductor wafer 702 having the active side 113 and the inactive side 117. The array 302 of the system interconnects 110 may be formed on the active side 113 of the semiconductor wafer 702. The active side 113 is characterized by the formation of circuits patterned on the surface.

A protective tape 704 may be applied on the system interconnects 110 and the active side 113. The protective tape 704 may provide a cushion barrier to protect the system interconnects 110 and the active side 113 from damage during subsequent handling and processing.

A singulation region 706 may mark the area on the active side 113 that resides between the patterned circuits. This area will subsequently be removed by mechanical, chemical, or optical means. As an example, the singulation region may be removed by a saw (not shown).

Figure 8:
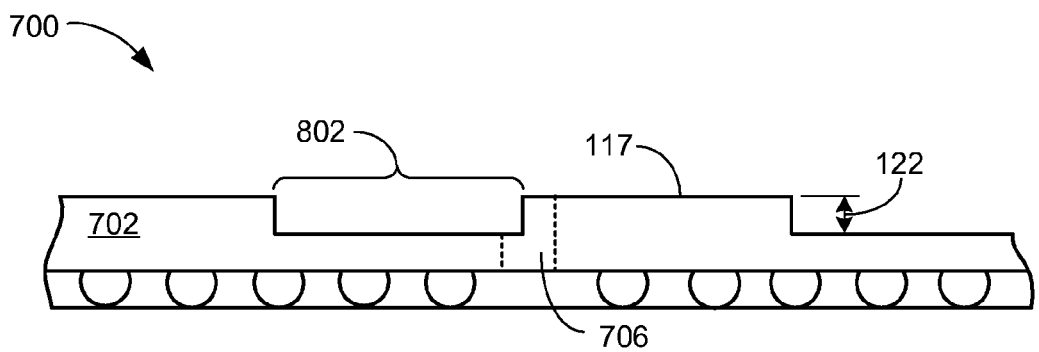
FIG. 8 is a cross-sectional view of the flip chip semiconductor wafer, in a protrusion forming phase of manufacturing, as viewed in a substantially similar cross-section to FIG. 7.

Referring now to FIG. 8, therein is shown a cross-sectional view of the flip chip semiconductor wafer 700, in a protrusion forming phase of manufacturing, as viewed in a substantially similar cross-section to FIG. 7. The cross-sectional view of the flip chip semiconductor wafer 700 depicts recesses 802 formed in the inactive side 117. The recesses 802 may be formed by grinding or etching the inactive side 117 of the semiconductor wafer 702. The recesses 802 may be formed to the step height 122 in an area adjacent to the singulation area 706.

The number and size of the recesses 802 is an example only and any number of the recesses 802 may be formed across the inactive side 117 of the semiconductor wafer 702. The recesses 802 may be formed in any direction across the inactive side 117 as required by the application to be packaged.

Figure 9:
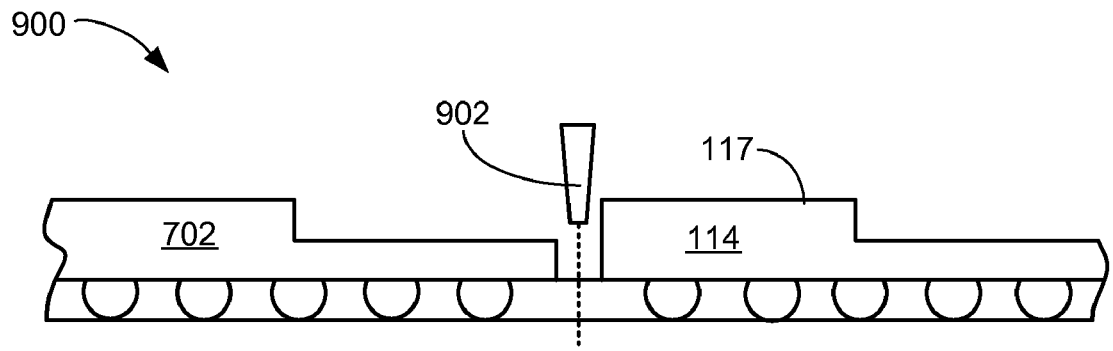
FIG. 9 is a cross-sectional view of a flip chip semiconductor wafer, in a singulation phase of manufacturing, as viewed in a substantially similar cross-section to FIG. 7.

Referring now to FIG. 9, therein is shown a cross-sectional view of a flip chip semiconductor wafer 900, in a singulation phase of manufacturing, as viewed in a substantially similar cross-section to FIG. 7. The cross-sectional view of the flip chip semiconductor wafer 900 depicts the flip chip die 114 singulated from the semiconductor wafer 702. A singulation device 902, such as a saw, a shear, a laser, or a chemical etcher, may be used to divide the flip chip die 114 from the semiconductor wafer 702.

Referring now to FIG. 10, therein is shown a top view of the flip chip semiconductor wafer 700 in a pre-singulation phase of manufacturing. The top view of the flip chip semiconductor wafer 700 depicts the section line 7-7 showing the section location and angle of view as shown on FIGS. 7, 8, and 9.

The flip chip semiconductor wafer 700 may have a number of singulation guides 1002 that may be positioned a particular locations around the periphery of the semiconductor wafer 702. The singulation guides 1002 are used to provide mechanical alignment of the singulation device 902, of FIG. 9, with the singulation area 706. The number and position of the singulation guides 1002 is an example only and the actual number and position may differ.

The singulation area 706, as viewed in the FIG. 10, may extend in the horizontal and vertical directions. The area that is surrounded by the singulation area 706 contains the flip chip die 114, of FIG. 1, which will be divided from the flip chip semiconductor wafer 700 as part of the singulation process.

Thus, it has been discovered that the integrated circuit packaging system with stacked die, of the present invention furnishes important and heretofore unknown and unavailable solutions, capabilities, and functional aspects for increasing the integrated circuit density within a package while simplifying the assembly process and reducing costs.

Figure 11:
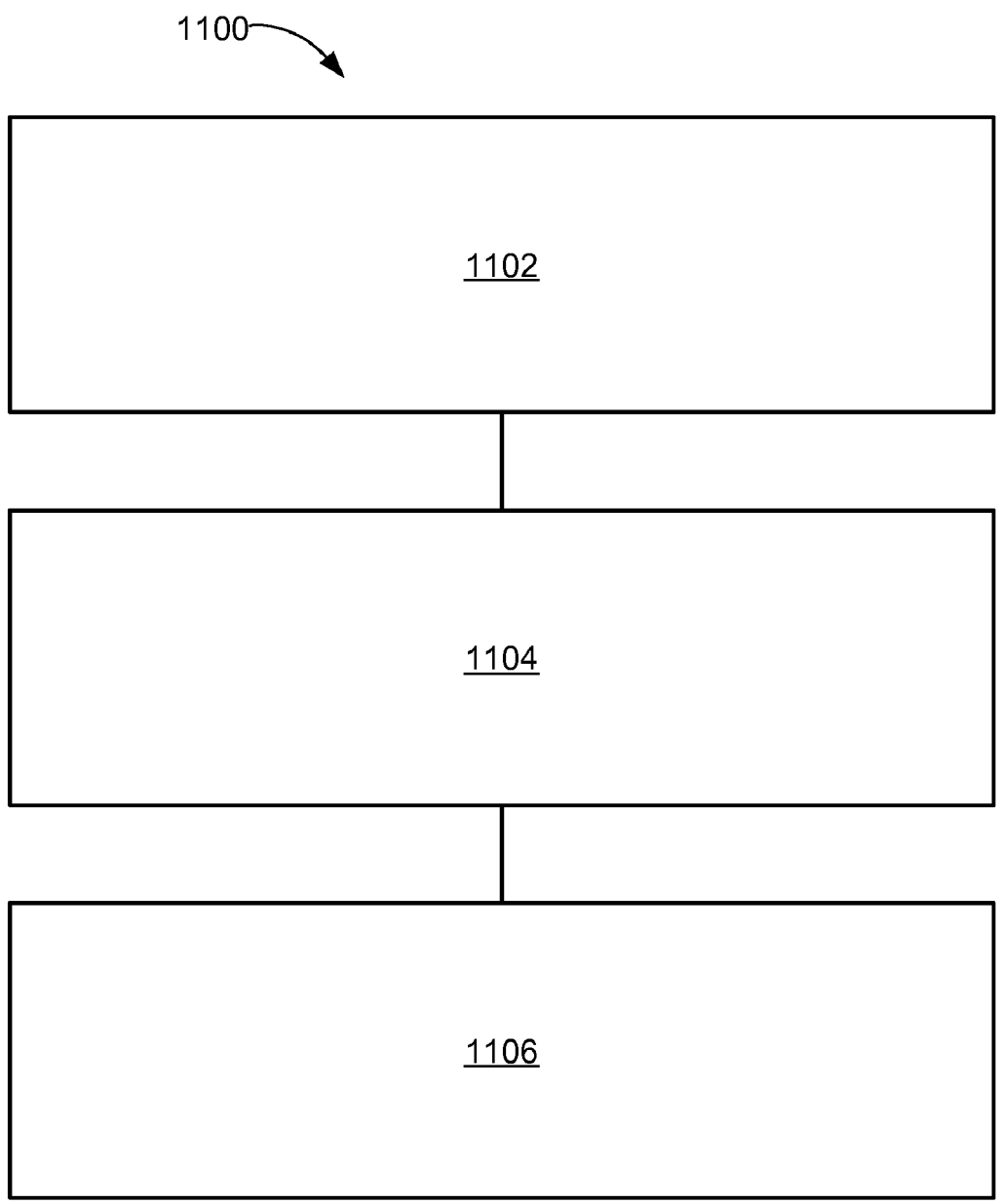
FIG. 11 is a flow chart of a method of manufacture of an integrated circuit packaging system in a further embodiment of the present invention.

Referring now to FIG. 11, therein is shown a flow chart of a method 1100 of manufacture of an integrated circuit packaging system in a further embodiment of the present invention. The method 1100 includes: forming a flip chip die, having a backside protrusion in a block 1102; mounting a wire bond die on the flip chip die, adjacent to the backside protrusion in a block 1104; and mounting an internal stacking module over the backside protrusion and the wire bond die in a block 1106.

The resulting method, process, apparatus, device, product, and/or system is straightforward, cost-effective, uncompli-cated, highly versatile and effective, can be surprisingly and unobviously implemented by adapting known technologies, and are thus readily suited for efficiently and economically manufacturing high density integrated circuit package systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    forming a flip chip die, having a backside protrusion providing an L-shaped cross-section;
    mounting a wire bond die on the flip chip die, adjacent to the backside protrusion a vertex of the L-shaped cross-section; and
    mounting an internal stacking module over the backside protrusion and the wire bond die.

2. The method as claimed in claim 1 further comprising providing a package substrate for forming an electrical connection between the flip chip die, the wire bond chip, the internal stacking module, a system interconnect, or a combination thereof.

3. The method as claimed in claim 1 further comprising applying wire-in-film adhesive or thermal interface material between the wire bond die and the internal stacking module.

4. The method as claimed in claim 1 wherein mounting the internal stacking module includes mounting an integrated circuit package, a stacking substrate, an integrated circuit die, or a heat spreader.

5. The method as claimed in claim 1 further comprising forming a stacked package body on the flip chip die, the wire bond die, and the internal stacking module.

6. A method of manufacture of an integrated circuit packaging system comprising:
    forming a flip chip die, having a backside protrusion providing an L-shaped cross-section including applying chip interconnects on an active side;
    mounting a wire bond die on the flip chip die, adjacent to a vertex of the L-shaped cross-section including coupling an electrical interconnect to the wire bond die; and
    mounting an internal stacking module over the backside protrusion and the wire bond die including applying an adhesive to the backside protrusion.

7. The method as claimed in claim 6 further comprising providing a package substrate for forming an electrical connection between a system interconnect, the flip chip die, the wire bond chip, the internal stacking module, or a combination thereof including coupling a contact pad to the electrical interconnects between the package substrate, the wire bond die, the internal stacking module, or a combination thereof.

8. The method as claimed in claim 6 further comprising applying wire-in-film adhesive or thermal interface material between the wire bond die and the internal stacking module including forming a platform by the adhesive, the wire-in-film adhesive, the thermal interface material, or a combination thereof 9. The method as claimed in claim 6 wherein mounting the internal stacking module includes mounting an integrated circuit package, a stacking substrate, an integrated circuit die, or a heat spreader including adhering a platform of the adhesive, wire-in-film adhesive, thermal interface material, or a combination thereof to the internal stacking module.

10. The method as claimed in claim 6 further comprising forming a stacked package body on the flip chip die, the wire bond die, and the internal stacking module including forming a stacking recess over the internal stacking module.

11. An integrated circuit packaging system comprising:
   a flip chip die, having a backside protrusion for providing an L-shaped cross-section;
   a wire bond die on the flip chip die, adjacent to a vertex of the L-shaped cross-section and
   an internal stacking module over the backside protrusion and the wire bond die.

12. The system as claimed in claim 11 further comprising a package substrate with an electrical connection between the flip chip die, the wire bond chip, the internal stacking module, a system interconnect, or a combination thereof.

13. The system as claimed in claim 11 further comprising wire-in-film adhesive or thermal interface material between the wire bond die and the internal stacking module.

14. The system as claimed in claim 11 wherein the internal stacking module includes an integrated circuit package, a stacking substrate, an integrated circuit die, or a heat spreader.

15. The system as claimed in claim 11 further comprising a stacked package body on the flip chip die, the wire bond die, and the internal stacking module.

16. The system as claimed in claim 11 further comprising:
   chip interconnects on the active side of the flip chip die;
   an electrical interconnect on the wire bond die; and
   an adhesive on the backside protrusion.

17. The system as claimed in claim 16 further comprising a package substrate with an electrical connection between a system interconnect, the flip chip die, the wire bond chip, the internal stacking module, or a combination thereof includes a contact pad coupled to the electrical interconnects between the package substrate, the wire bond die, the internal stacking module, or a combination thereof.

18. The system as claimed in claim 16 further comprising wire-in-film adhesive or thermal interface material between the wire bond die and the internal stacking module includes a platform of the adhesive, the wire-in-film adhesive, the thermal interface material, or a combination thereof.

19. The system as claimed in claim 16 wherein the internal stacking module includes an integrated circuit package, a stacking substrate, an integrated circuit die, or a heat spreader including a platform of the adhesive, wire-in-film adhesive, thermal interface material, or a combination thereof adhered to the internal stacking module.

20. The system as claimed in claim 16 further comprising a stacked package body on the flip chip die, the wire bond die, and the internal stacking module includes a stacking recess over the internal stacking module.

* * * * *

UNITED STATES PATENT AND TRADEMARK OFFICE
CERTIFICATE OF CORRECTION

PATENT NO. : 7,977,802 B2  
APPLICATION NO. : 12/398782  
DATED : July 12, 2011  
INVENTOR(S) : Pagaila et al.

Page 1 of 1

It is certified that error appears in the above-identified patent and that said Letters Patent is hereby corrected as shown below:

Column 3:
line 67, delete "wire bond die 130 is" and insert therefor --wire bond die 120 is--

Column 7:
line 36, delete "as shown on FIGS. 7, 8, and 9." and insert therefor --as shown on FIG 7, 8, and 9.--

Column 9:
line 18, delete "cross-section and" and insert therefor --cross-section; and--

Signed and Sealed this  
Fifth Day of June, 2012

David J. Kappos  
*Director of the United States Patent and Trademark Office*